(12) United States Patent
Rotondaro et al.

(10) Patent No.: US 8,021,990 B2
(45) Date of Patent: Sep. 20, 2011

(54) GATE STRUCTURE AND METHOD

(75) Inventors: Antonio L. P. Rotondaro, Dallas, TX (US); Luigi Colombo, Dallas, TX (US); Mark R Visokay, Richardson, TX (US); Rajesh Khamankar, Coppell, TX (US); Douglas E Mercer, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 145 days.

(21) Appl. No.: 12/421,036

(22) Filed: Apr. 9, 2009

(65) Prior Publication Data
US 2009/0227117 A1  Sep. 10, 2009

Related U.S. Application Data

(62) Division of application No. 10/349,686, filed on Jan. 23, 2003, now Pat. No. 7,535,066.

(60) Provisional application No. 60/351,323, filed on Jan. 23, 2002.

(51) Int. Cl.
*H01L 21/31* (2006.01)
*H01L 21/469* (2006.01)

(52) U.S. Cl. ......... 438/778; 257/E21.191; 257/E21.637; 257/E21.639; 438/216; 438/585; 438/591; 438/783; 438/785

(58) Field of Classification Search ........... 257/E21.191, 257/E21.637, E21.639; 438/216, 585, 591, 438/778, 783, 785
See application file for complete search history.

(56) References Cited

U.S. PATENT DOCUMENTS

| | | | |
|---|---|---|---|
| 4,810,580 A | 3/1989 | Rice | |
| 6,020,243 A * | 2/2000 | Wallace et al. | 438/287 |
| 6,203,613 B1 | 3/2001 | Gates et al. | |
| 6,300,202 B1 | 10/2001 | Hobbs et al. | |
| 6,444,495 B1 | 9/2002 | Leung et al. | |
| 6,511,876 B2 | 1/2003 | Buchanan et al. | |
| 2001/0023120 A1 | 9/2001 | Tsunashima et al. | |
| 2003/0030084 A1 | 2/2003 | Moise et al. | |
| 2004/0036123 A1 * | 2/2004 | Keating et al. | 257/368 |

FOREIGN PATENT DOCUMENTS
JP   57-43433   3/1982

* cited by examiner

*Primary Examiner* — Asok K Sarkar
(74) *Attorney, Agent, or Firm* — Jacqueline J. Garner; Wade J. Brady, III; Frederick J. Telecky, Jr.

(57) ABSTRACT

A MOSFET structure including silicate gate dielectrics with nitridation treatments of the gate dielectric prior to gate material deposition.

6 Claims, 2 Drawing Sheets

GATE STRUCTURE AND METHOD

RELATED APPLICATIONS

This is a divisional application of Ser. No. 10/349,686 filed Jan. 23, 2003 which is a non-provisional application of Ser. No. 60/351,323 filed Jan. 23, 2002.

This application claims priority from provisional patent application Ser. No. 60/351,323, filed Jan. 23, 2002. The following patent applications disclose related subject matter: U.S. Ser. No. 10/232,124 filed Aug. 30, 2002. These applications have a common assignee with the present application.

BACKGROUND OF THE INVENTION

The invention relates to electronic semiconductor devices, and, more particularly, to gate structures and fabrication methods for integrated circuits.

The trend in semiconductor integrated circuits to higher device densities by down-scaling structure sizes and operating voltages has led to silicon field effect (MOS) transistor gate dielectrics, typically made of silicon dioxide, to approach thicknesses on the order of 1-2 nm to maintain the capacitive coupling of the gate to the channel. However, such thin oxides present leakage current problems due to carrier tunneling through the oxide. Consequently, alternative gate dielectrics with greater dielectric constants to permit greater physical thicknesses have been proposed. Indeed, $Ta_2O_5$, $(Ba,Sr)TiO_3$, and other high dielectric constant materials have been suggested, but such materials have poor interface stability with silicon.

Wilk and Wallace, Electrical Properties of Hafnium Silicate Gate Dielectrics Deposited Directly on Silicon, 74 Appl. Phys. Lett. 2854 (1999), disclose measurements on capacitors with a hafnium silicate dielectric formed by sputtering deposition (at a pressure of $6.7\times10^{-7}$ Pa ($5\times10^{-6}$ mTorr) and substrate temperature of 500 C) of a 5 nm thick $Hf_6Si_{29}O_{65}$ ($Hf_{0.18}Si_{0.89}O_2$) layer directly onto silicon together with a gold top electrode deposition onto the silicate dielectric. Such capacitors showed low leakage current, thermal stability, an effective dielectric constant of about 11, and a breakdown field of 10 MV/cm.

However, such silicate dielectrics have problems with high volume production of silicon integrated circuits such as reactivity with the subsequently deposited gate material.

SUMMARY OF THE INVENTION

The present invention provides integrated circuit fabrication with a nitrogen-based treatment of silicate gate dielectric prior to gate material formation.

This has advantages including limiting reaction of silicate gate dielectric with gate material.

BRIEF DESCRIPTION OF THE DRAWINGS

The drawings are heuristic for clarity.

DESCRIPTION OF THE PREFERRED EMBODIMENTS

1. Overview

Preferred embodiment integrated circuits and MOS transistors include metal silicate gate dielectrics and/or metal gates with differing work functions within the same integrated circuit. Preferred embodiment fabrication methods include treatments of a substrate surface prior to gate dielectric deposition, treatment of a gate dielectric surface prior to deposition of gate material, metal gates of two different metals or textures on the same integrated circuit, . . . .

2. Silicon Gate with Silicate Gate Dielectric Preferred Embodiments

FIGS. 1a-1g illustrate in cross sectional elevation views the steps of first preferred embodiment fabrication methods for integrated circuits including field effect transistors (e.g., CMOS or BiCMOS) with silicate gate dielectrics and polysilicon gates. The preferred embodiments include the following steps:

(1) Substrate.

Figure 1A:
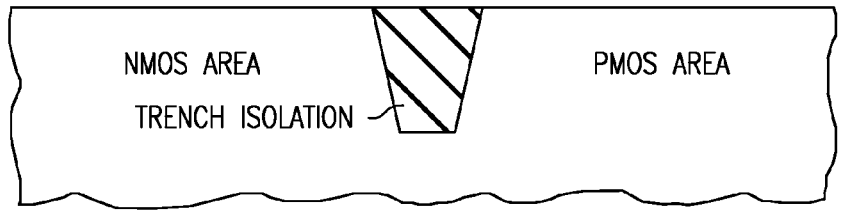
FIGS. 1a-1g are cross sectional elevation views of steps of a preferred embodiment integrated circuit fabrication method.
Figure 1B:
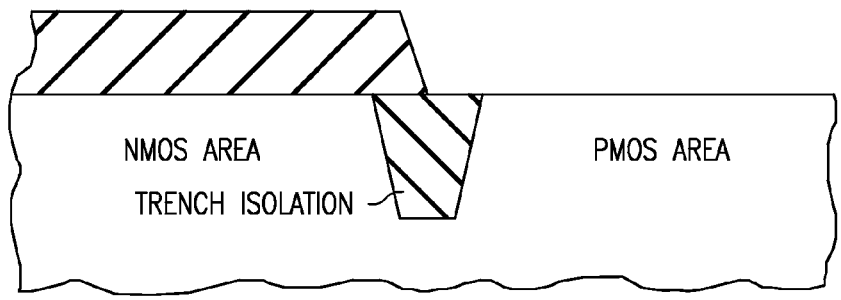

Start with a p-type silicon (or silicon-on-insulator) wafer with <100> orientation and form shallow trench isolation by pad oxide growth, nitride deposition, trench pattern, nitride-oxide-silicon trench etch, trench surface oxidation, trench fill by blanket APCVD oxide deposition, etch-CMP planarization, and nitride strip. FIG. 1a is a cross-sectional elevation view of the substrate illustrating the trench isolation and locations for fabrication of NMOS and PMOS transistors. Next, perform multiple dopant implants to form n- and p-type wells (plus, optionally, memory cell array wells and bipolar device buried layers) plus form channel stop regions, punch-through deterrence regions, and threshold adjust regions. These implants are performed through the residual pad oxide. FIG. 1b illustrates the masked NMOS transistor location implants; a similar masked implant occurs in the PMOS locations. Note that the implant doses and depths may differ for memory cell array transistors as compared to peripheral transistors. Also, both high and low voltage transistors of the same type may be formed and may have different implant doses and depths. A rapid thermal anneal (e.g., 1050 C for 30 s) activates and diffuses the implanted dopants (e.g., boron and phosphorus).

(2) Gate Dielectric Deposition.

Deposit $Hf_{0.55}Si_{0.45}O_2$ by LPCVD to a thickness of about 7 nm. The LPCVD precursors may be $SiH_4$, $N_2O$, and $Hf(CH_3)_4$ at a pressure of 10 Pa (75 mTorr) and with a substrate temperature of about 500 C. The ratio of oxygen to hafnium and silicon precursors should be at least 10 to 1 to insure complete oxidation and no Hf—Si bonds. The hafnium source may include a carrier gas such as argon or nitrogen which is passed through a bubbler containing the hafnium precursor. The precursor ratio of hafnium to silicon determines the composition of the resultant silicate. A Hf-rich silicate provides a higher dielectric constant and also deters crystallization to maintain the dielectric as amorphous. The precursors essentially decompose and react on the growing surface, and the overall reaction roughly approximates:

$$SiH_4 + Hf(CH_3)_4 + 20N_2O \rightarrow HfSiO_4 + 4CO_2 + 8H_2O + 20N_2.$$

Figure 1C:
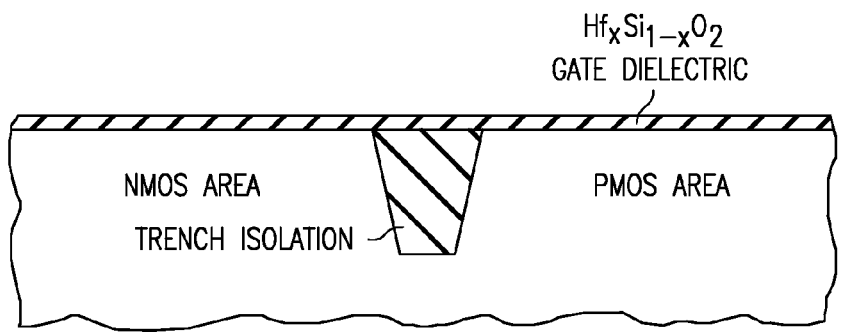
Figure 1D:
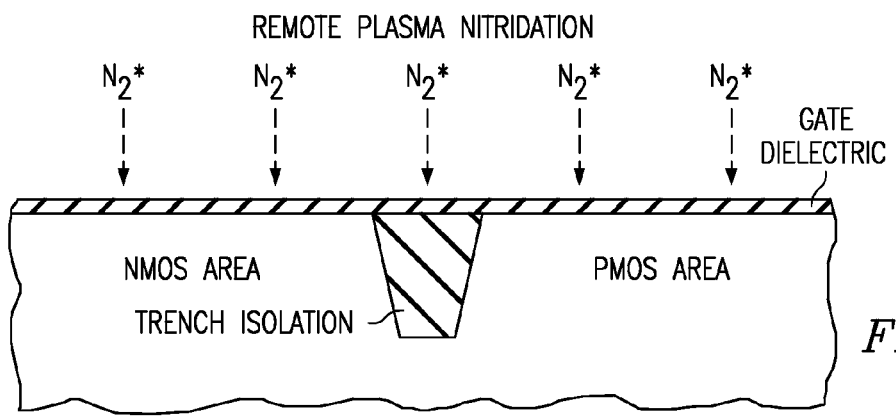
Figure 1E:
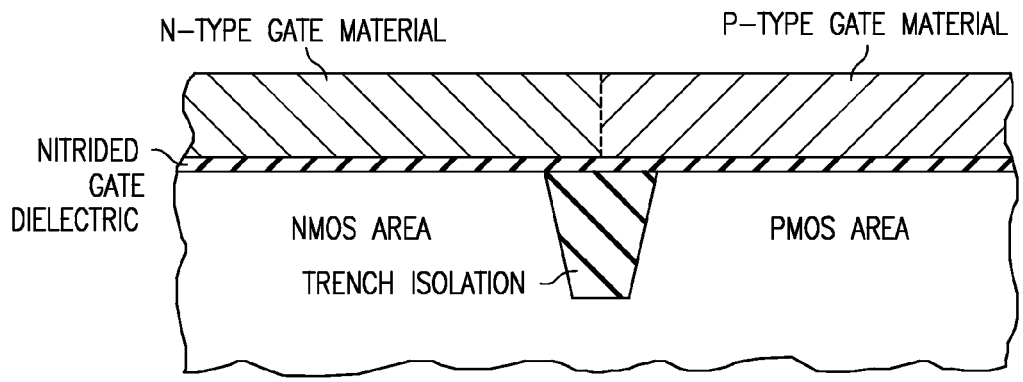

Other Hf precursors such as bis-acetylacetone hafnium, TDMAH (tetrakis-dimethylamino hafnium), or $HfCl_4$ could be used instead of $Hf(CH_3)_4$. This deposition of silicate results in an effective dielectric constant of about 14, so the 7 nm thick silicate has an equivalent silicon dioxide thickness of 2 nm but not the leakage (tunneling) current of such a thin silicon dioxide gate dielectric. FIG. 1c illustrates the substrate with gate dielectric.

(2') Split Gate Option.

Various integrated circuits include both high voltage and low voltage transistors; that is, MOS transistors with differing operating voltages such as differing maximum source-drain voltages and gate-source voltages. For example, high voltage transistor could be used for peripheral transistors or programmable transistors, and low voltage transistors used for central processor or memory array transistors to limit power consumption and heat generation. High voltage MOS transistors require a thicker gate dielectric than low voltage MOS transistors in order to avoid breakdown. A modification of the foregoing step (2) can provide for two or more transistor gate dielectric thicknesses through various approaches. For example, first grow a thin silicon dioxide layer; next, strip this oxide layer in areas for low voltage transistors; then perform the passivation and silicate deposition of step (2) with silicate dielectric thickness targeted for the low voltage transistors. The unremoved initial grown oxide under the silicate dielectric in the areas for high voltage transistors provides the required extra dielectric thickness.

(3) Silicate Gate Dielectric Surface Nitridation.

The $Hf_xSi_{1-x}O_2$ gate dielectric layer deposited in step (2) or (2') may interact with polysilicon or amorphous silicon gate material during the initial stages of gate level deposition. Also, boron diffusion from the p-type gate in PMOS transistors (or phosphorus from n-type gates of NMOS) through the gate dielectric and into the channel region effectively depletes the doping level at the gate-gate dielectric interface and increases the transistor threshold voltage. Thus form a silicon nitride diffusion barrier at the top of the silicate gate dielectric prior to deposition of gate material. The diffusion barrier need only be 1-2 monolayers thick and has minimal effect on the overall dielectric constant. Thus, grow about two monolayers of silicon nitride by remote plasma nitridation; see FIG. 1d. In particular, excite $N_2$ at a pressure of 1 Pa (7.5 mTorr) into a plasma by microwave power (e.g., 1000 W at 2 GHz) in a cavity remote from the silicate-coated substrate and transport excited neutral $N_2$ molecules ($N_2^*$) generated in the plasma to the silicate surface. The $N_2^*$ reacts with the surface silicate by essentially replacing surface O atoms and forming silicon nitride because Hf—O bonds are stronger than Si—O bonds. The overall reaction is roughly:

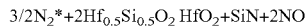

$$3/2 N_2^* + 2Hf_{0.5}Si_{0.5}O_2 \rightarrow HfO_2 + SiN + 2NO$$

Limit the nitridation time to form only about two monolayers of silicon nitride; this thickness suffices to form a surface barrier on the silicate.

(4) Gate Material Deposition.

Deposit a layer of amorphous silicon (or polysilicon) gate material of thickness 300 nm on the treated silicate gate dielectric. The deposition may be low temperature decomposition of silane. Then dope the gate material n and p type in the NMOS and PMOS areas, respectively, by non-critical photoresist masking and dopant implantations. (Polysilicon emitters for npn bipolars would be in the n type area.) See FIG. 1e. Note that during source/drain doping the gates may receive further dopants, and, optionally, the gate material doping in this step can be omitted and only the doping from the source/drain step used.

(5) Gate Mask.

Spin on a layer of photoresist which is sensitive to deep ultraviolet; optionally, an antireflective coating (ARC) layer could be deposited prior to the photoresist in order to limit interference effects during photoresist exposure. The composition of the ARC and thickness are selected according to the exposure wavelength and the reflectivity of the underlying material. Expose the photoresist through a reticle for gates and gate level interconnects; the exposed minimal linewidth may be about 100 nm. Lastly, develop photoresist and strip exposed ARC, if any.

(6) Gate Etch.

Use the patterned photoresist as an etch mask for the anisotropic plasma etch of polysilicon to form gates and gate level interconnects. The etch may be an HBr plus oxygen plasma which is very selective to (nitride-capped) silicate. If the polysilicon etch erodes the photoresist, the underlying ARC layer provides sufficient etch masking. The gate material could also provide a polysilicon emitter for bipolar devices. Gates are 300 nm high and 100 nm long (FIGS. 1f-1g are cross sectional elevation views along the gate length, and gates typically have widths much greater than their lengths).

(7) Interlevel Dielectric

Figure 1F:
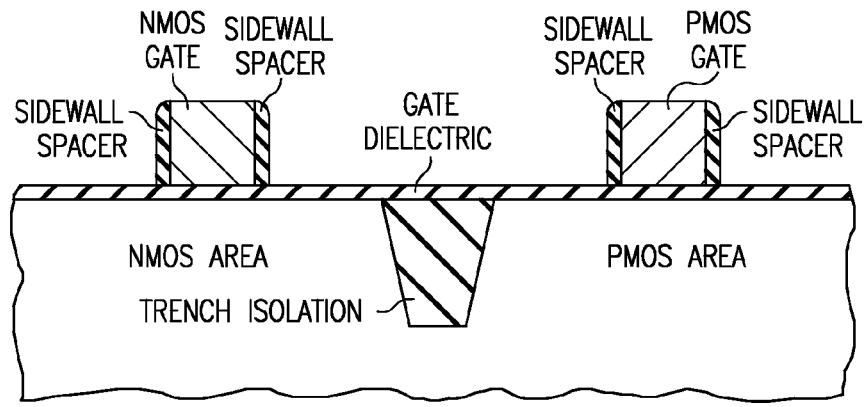
Figure 1G:
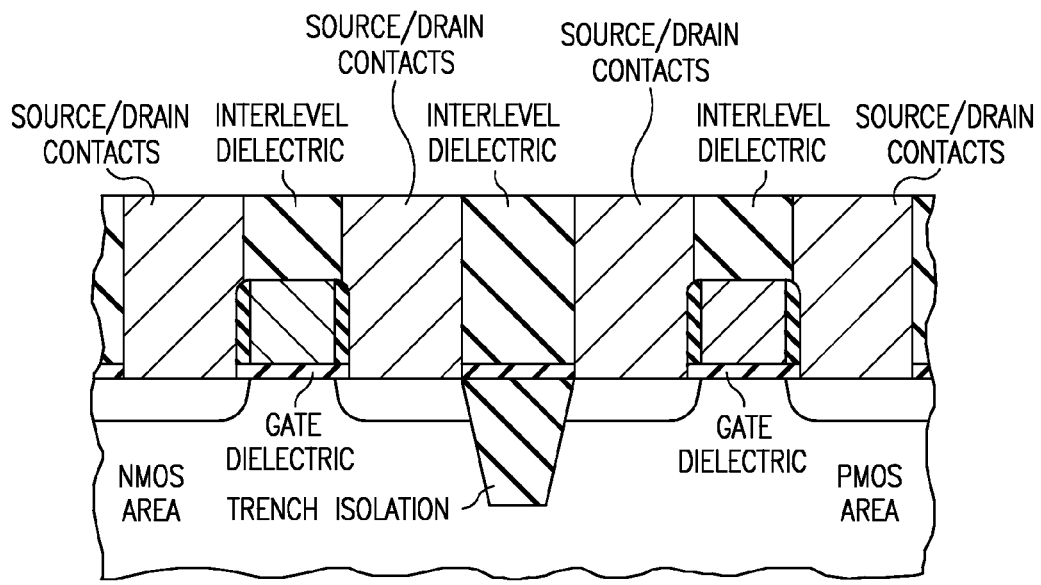

FIG. 1f illustrates the gates plus sidewall dielectrics (e.g., silicon nitride) formed by blanket deposition followed by anisotropic removal. Prior to sidewall dielectric formation, implant any lightly-doped drains, and after sidewall dielectric formation, implant source/drains. Then, form planarized interlevel dielectric plus vias through the interlevel dielectric for contacts to source/drains; see FIG. 1g. Further interconnect and interlevel dielectric levels (which may have a dual damascene structure) plus packaging completes the integrated circuit.

3. Disposable Gate Preferred Embodiments

A disposable gate preferred embodiment method of integrated circuit fabrication also uses the silicate gate dielectric nitridation. In particular, follow the foregoing steps (1)-(7) but omitting the gate doping to have a polysilicon dummy gate with sidewall spacers and source/drains formed in the substrate.

Deposit 200 nm thick dielectric, such as TEOS oxide, and planarize, such as by CMP, to expose the top of the polysilicon dummy gate.

Etch out the dummy gate with an HBr+O2 plasma which stops on the silicate gate dielectric. The silicate gate dielectric under the dummy gates had received the nitridation from step (3), but, optionally, a further nitridation could be performed at this point. An alternative is: use a silicon dioxide gate dielectric for the (undoped) dummy gates (so step (3) is omitted), next, strip the oxide gate dielectric along with the dummy gate, and then deposit a 7 nm thick silicate gate dielectric at the bottom of the groove left by the removal of dummy gate and oxide. This would also deposit roughly 7 nm of silicate on the sidewalls to shorten the eventual gate to 86 nm. Next, apply the remote plasma nitridation of step (3). Then blanket deposit silicon gate material, and proceed to form gates (T-shaped) and the remainder of the integrated circuit interconnects and interlevel dielectrics and packaging.

4. Modifications

The preferred embodiments can be modified in various ways while retaining the feature of nitridation of a silicate gate dielectric.

For example, the silicate gate dielectric could be formed by sputtering or other methods; the silicate gate dielectric could have other compositions such as $Hf_xSi_{1-x}O_2$, $Zr_xSi_{1-x}O_2$, $Hf_xSi_yN_z$, $Zr_xSi_yN_z$, and mixtures thereof; the gate materials could be metals, silicides, polycides, or combinations instead of the silicon gates of the preferred embodiments; the dimensions could vary; and so forth.

What is claimed is:

1. A method of fabrication of an integrated circuit, comprising the steps of:
   (a) forming a silicate gate dielectric layer; and
   (b) nitriding the surface of said gate dielectric layer to form a surface-nitrided silicate gate dielectric layer.

2. The method of claim 1, wherein the surface nitrided silicate gate dielectric layer has 1-2 monolayers of silicon-nitride.

3. The method of claim 1, wherein the silicate gate dielectric comprises a material selected from the group consisting of hafnium-silicon-oxide, zirconium-silicon-oxide, hafnium-silicon-nitride, and zirconium-silicon-nitride.

4. A method of fabrication of an integrated circuit, comprising the steps of:
   (a) forming a silicate gate dielectric layer; and
   (b) nitriding the surface of said gate dielectric layer to form a silicon nitride diffusion barrier at the top of the silicate gate dielectric layer.

5. The method of claim 4, wherein the silicon nitride diffusion barrier has 1-2 monolayers of silicon-nitride.

6. The method of claim 4, wherein the silicate gate dielectric comprises a material selected from the group consisting of hafnium-silicon-oxide, zirconium-silicon-oxide, hafnium-silicon-nitride, and zirconium-silicon-nitride.

* * * * *